(12) United States Patent
Nakamura

(10) Patent No.: US 11,309,057 B2
(45) Date of Patent: Apr. 19, 2022

(54) APPARATUSES AND METHODS FOR POST-PACKAGE REPAIR PROTECTION

(71) Applicant: MICRON TECHNOLOGY, INC., Boise, ID (US)

(72) Inventor: Takaaki Nakamura, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/861,090

(22) Filed: Apr. 28, 2020

(65) Prior Publication Data

US 2021/0335446 A1    Oct. 28, 2021

(51) Int. Cl.
| G11C 29/00 | (2006.01) |
| G11C 29/12 | (2006.01) |
| G11C 29/44 | (2006.01) |
| G11C 29/18 | (2006.01) |

(52) U.S. Cl.
CPC ...... *G11C 29/787* (2013.01); *G11C 29/12015* (2013.01); *G11C 29/44* (2013.01); *G11C 2029/1202* (2013.01); *G11C 2029/1802* (2013.01)

(58) Field of Classification Search
None
See application file for complete search history.

(56) References Cited

U.S. PATENT DOCUMENTS

| 5,548,555 | A  | * | 8/1996  | Lee ...................... | G11C 29/785 |
|           |    |   |         |                            | 365/200     |
| 6,178,126 | B1 | * | 1/2001  | Kirihata ................. | G11C 29/72  |
|           |    |   |         |                            | 365/200     |
| 6,240,033 | B1 | * | 5/2001  | Yang ...................... | G11C 17/18  |
|           |    |   |         |                            | 257/50      |
| 6,272,056 | B1 | * | 8/2001  | Ooishi ................... | G11C 29/848 |
|           |    |   |         |                            | 365/189.18  |
| 10,403,390 | B1 | * | 9/2019 | Wilson ................... | G11C 17/16  |
| 2007/0086252 | A1 | * | 4/2007 | Lim ....................... | G11C 29/24  |
|           |    |   |         |                            | 365/200     |
| 2013/0308401 | A1 | * | 11/2013 | Yang ...................... | G11C 29/06  |
|           |    |   |         |                            | 365/191     |
| 2014/0078842 | A1 | * | 3/2014 | Oh ........................ | G11C 29/785 |
|           |    |   |         |                            | 365/200     |
| 2016/0069954 | A1 | * | 3/2016 | Moon ................. | G01R 31/31701 |
|           |    |   |         |                            | 714/726     |
| 2016/0308532 | A1 | * | 10/2016 | Koo ...................... | G11C 29/021 |
| 2016/0351277 | A1 | * | 12/2016 | Chi ........................ | G11C 29/24 |

\* cited by examiner

*Primary Examiner* — J. H. Hur
(74) *Attorney, Agent, or Firm* — Dorsey & Whitney LLP

(57) ABSTRACT

Apparatuses and methods for post-package repair (PPR) protection. A device may enter a PPR mode to repair one or more memory addresses by blowing fuses. However, fuses may be incorrectly blown if the device receives row activation (ACT) signals while in the PPR mode. A PPR mask circuit may provide a PPR mask signal if an ACT signal is received while the memory is in the PPR mode. The PPR mask signal may suppress further ACT signals from being provided. In some embodiments, the memory may also include a PPR function circuit, which may monitor one or more signals used as part of PPR operations. If these signals are in an illegal state, the PPR function circuit may suppress PPR operations to prevent damage to the fuse array.

17 Claims, 12 Drawing Sheets

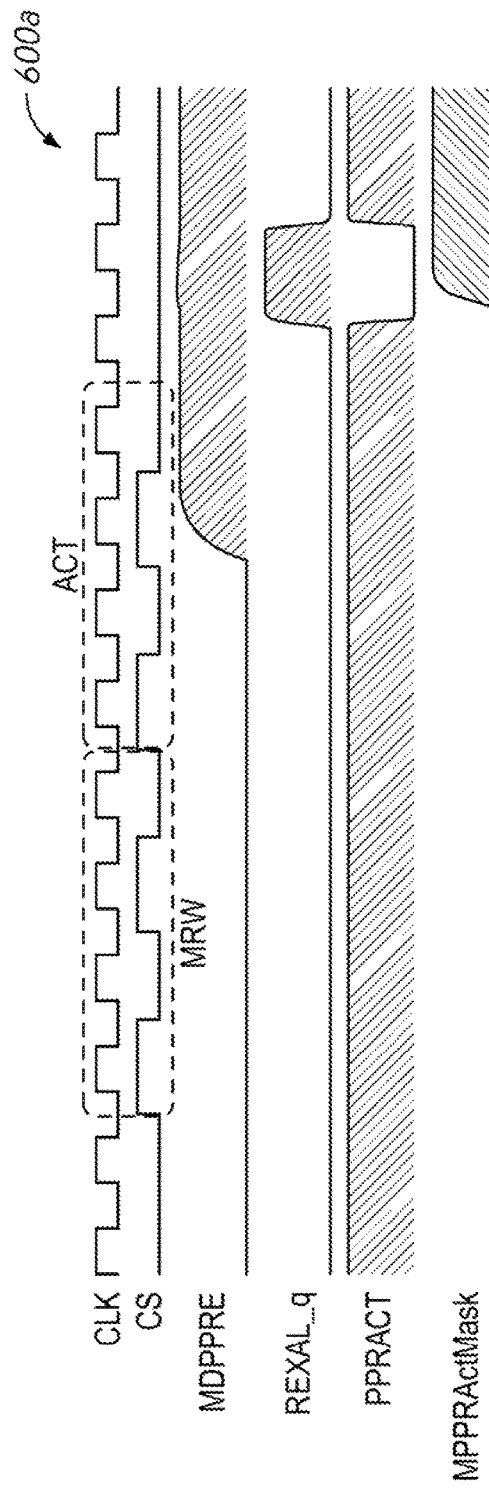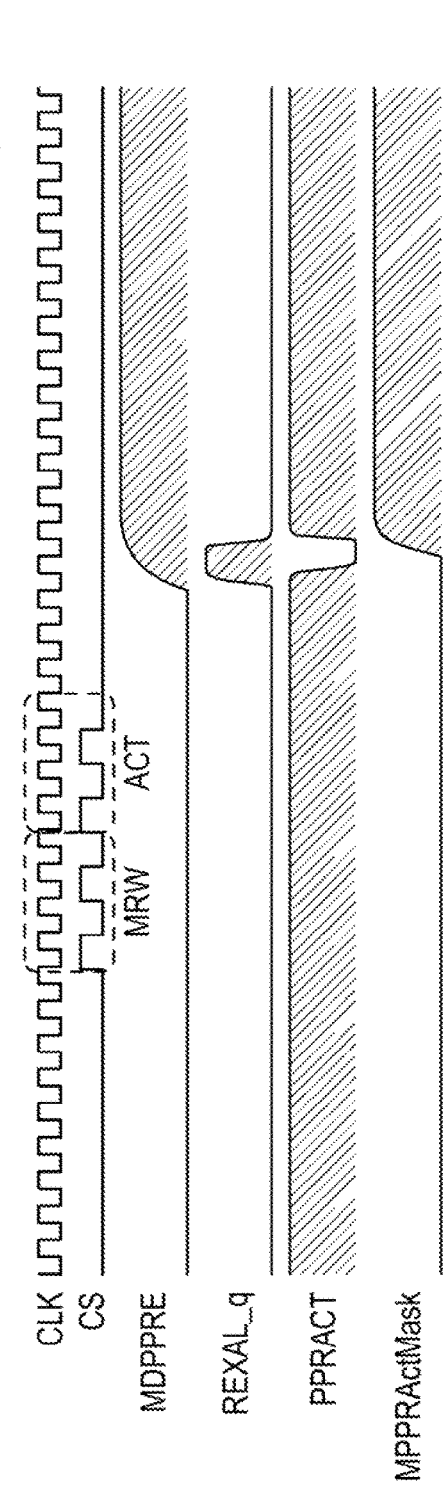

APPARATUSES AND METHODS FOR POST-PACKAGE REPAIR PROTECTION

BACKGROUND

This disclosure relates generally to semiconductor devices, and more specifically to semiconductor memory devices. In particular, the disclosure relates to memory, such as dynamic random access memory (DRAM). Information may be stored in memory cells, which may be organized into rows (word lines) and columns (bit lines). At various points in manufacturing and use of a memory device, one or more memory cells may fail (e.g., become unable to store information, be inaccessible by the memory device, etc.) and may need to be repaired.

The memory device may perform repair operations on a row-by-row basis. A row containing a failed memory cell (which may be referred to as a defective row, a bad row, or a faulty row) may be identified. The memory device may contain additional rows of memory (which may also be referred to as redundant rows) which may be used in repair operations. During a repair operation, an address associated with the defective row may be redirected, such that the address points to a redundant row instead. Some defective rows may not be identified (and/or may not become defective) until after the device is packaged, and a post-package repair (PPR) operation may be used to redirect the memory address from the defective row to a redundant row. It may be important to ensure that the device does not perform 'illegal' commands while in PPR mode, as these may cause unintended changes to the device.

BRIEF DESCRIPTION OF THE DRAWINGS

FIGS. 6A-6C are timing diagrams of modeling the timing of various signals involved with a PPR. Act Mask circuit according to some embodiments of the present disclosure.

DETAILED DESCRIPTION

Figure 1:
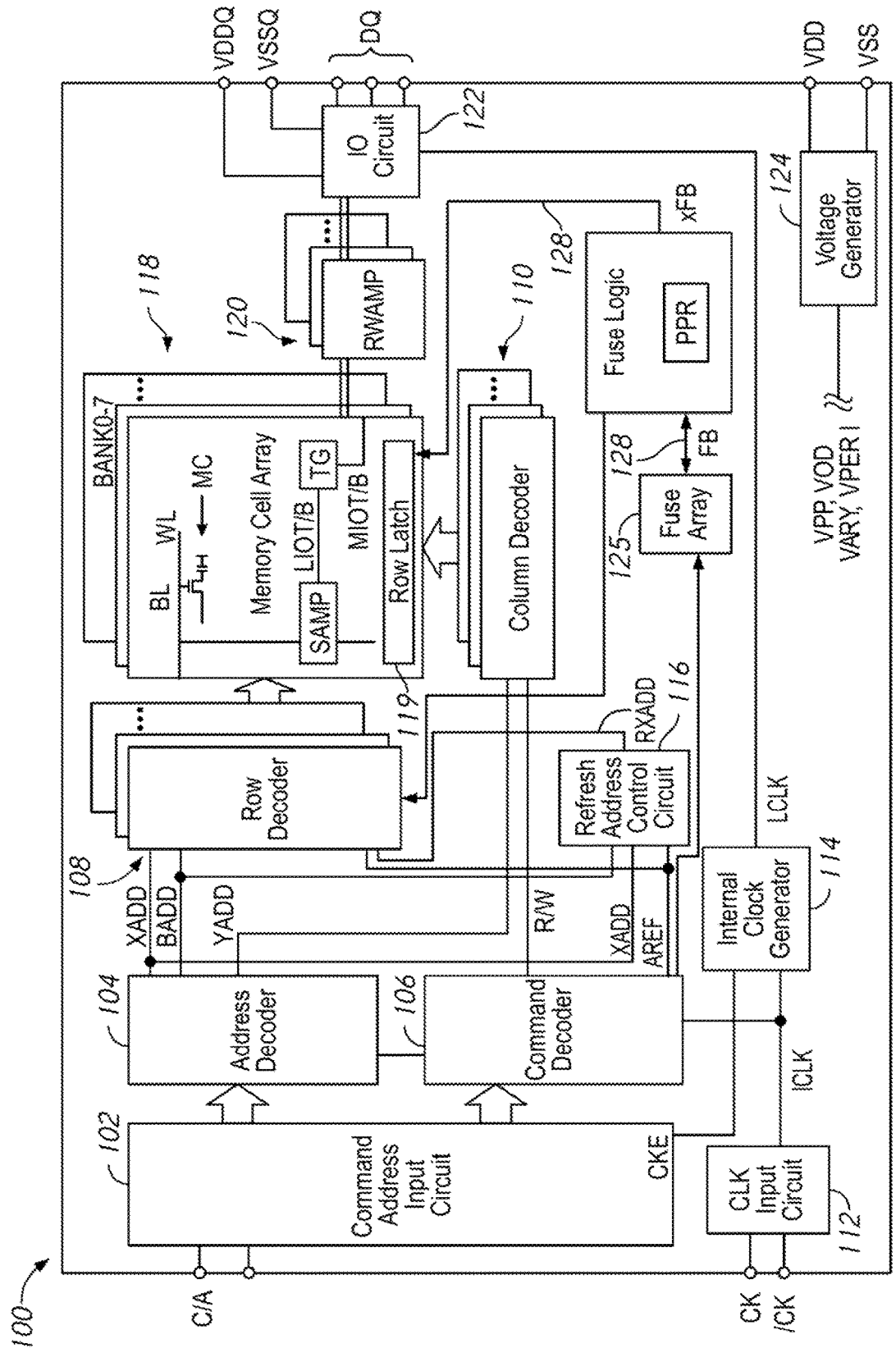
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store information in a plurality of memory cells. The information may be stored as a binary code, and each memory cell may store a single bit of information as either a logical high (e.g., a "1") or a logical low (e.g., a "0"). The memory cells may be organized at the intersection of word lines (rows) and bit lines (columns). The memory may further be organized into one or more memory banks, each of which may include a plurality of rows and columns. During operations, the memory device may receive a command and an address which specifies one or more rows and one or more columns and then execute the command on the memory cells at the intersection of the specified rows and columns (and/or along an entire row/column). The command may include a row activation command, such as an ACT command, which may cause a row activation (or ACT) signal to be provided in the memory, which may cause one (or more) rows to be activated.

Certain memory cells may be defective, and rows containing the defective memory cells may generally be referred to as defective rows (or bad rows or faulty rows). The defective rows may be incapable of storing information and/or may become otherwise inaccessible to the memory device. In some cases, rows of the memory may become defective (and/or may be identified as defective) after the memory device is packaged (e.g., sealed in a chip package). The memory device may carry out one or more types of post-package repair (PPR) operation to resolve the defective rows.

Memory banks may generally include a number of additional rows of memory, which may generally be referred to as redundant rows. During a repair operation, a row address associated with a defective row may be redirected so that it is associated with one of the redundant rows instead. The repair operation may involve storing the updated row address information in the memory in a non-volatile form (e.g., stored in a manner that is maintained even when the memory device is powered down). For example, the memory device may include fuse banks, which may include fuses (and/or anti-fuses) which may have state that can be permanently changed (e.g., when the fuse/anti-fuse is "blown"). The state of the fuses/anti-fuses in the fuse bank may, in part, determine which addresses are associated with which rows of memory. During a PPR operation, the memory may be entered into a PPR mode, and may receive commands (e.g., addresses in the fuse bank and addresses of the defective rows) which indicate which fuses are to be blown. Under normal operations, ACT commands may not be received during PPR operations. However, in certain failure states, the memory device may be in a PPR mode while ACT signals are still being provided. In the PPR mode, these ACT signals may cause inadvertent damage to the fuse array (e.g., blowing fuses which were not intended to be blown). Accordingly, it may be important to protect the memory from ACT commands and signals during a PPR mode.

The present disclosure is drawn to apparatuses, systems, and methods for post-package repair protection. A memory device may include an ACT mask circuit, which may, when the memory device is in a PPR mode, provide an ACT mask signal at an active level responsive to a first ACT signal being received. The ACT mask signal may be used to suppress further activations of the ACT signal. For example, a command decoder of the memory may not provide any further activations of ACT as long as the signal ACT mask is active regardless of any ACT commands received. In this manner, damage may be limited to the first activation of an ACT signal. The ACT mask signal may reset to an inactive level when the PPR operations finish.

In certain situations (e.g., failure modes), the normal order of signals in the memory may be interrupted which may cause the ACT mask circuit to fail to properly provide the ACT mask signal. For example, in some scenarios, the memory may receive a PPR mode entry signal and then an ACT signal, but the ACT mask circuit may not respond to the PPR mode entry signal until after responding to the ACT signal. This may allow a second ACT signal to be provided. Each ACT signal may cause one or more internal PPR signals (e.g., fuse blow signals) to become active. In some embodiments, a PPR function circuit may monitor the internal PPR signals, and may suppress the internal PPR signals if more than one becomes active at the same time. This may prevent further fuse blow operations from occurring even in scenarios where the ACT mask signal fails to properly activate.

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 118. The memory army 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder 108 and the selection of the bit lines BL and/BL is performed by a column decoder 110. In the embodiment of FIG. 1, the row decoder 108 includes a respective row decoder for each memory bank and the column decoder 110 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The device also includes a fuse array 125, which contains a plurality of non-volatile storage elements which may store information about addresses in the memory array 118. The fuse array 125 includes non-volatile storage elements, such as fuses or anti-fuses. Each fuse may be in a first state where it is conductive, and may be 'blown' to make the fuse insulating instead. Each anti-fuse may be in a first state which is non-conductive, until it is blown to make the anti-fuse conductive instead. Each fuse/anti-fuse may permanently change when it is blown. Each fuse/anti-fuse may be considered to be a bit, which is in one state before it is blown, and permanently in a second state after it's blown. For example, a fuse may represent a logical low before it is blown and a logical high after it is blown, while an anti-fuse may represent a logical high before it is blown and a logical low after it is blown. For brevity, the term fuse may be used generically herein to refer to the elements in the fuse array 125, however it should be understood that fuse arrays 125 may include fuses, anti-fuses, or combinations thereof.

Specific groups of fuses may be represented by a fuse bank address, which may specify the physical location of each of the fuses in the group within the fuse array 125. Certain groups of fuses of the fuse array may in turn encode an address associated with one or more memory cells of the memory array 118. For example, a group of fuses may have a state which represents a row address (e.g., the status of the fuses may represent the bits of the row address). The address information in the fuse array 125 may be 'scanned' out along a fuse bus (FB and xFB) 128 to row latches 119. Each row latch 119 may be associated with a particular wordline of the memory array 118. In some embodiments, only the redundant rows of the memory array 118 (e.g., the rows designated for use in repair operations) may be associated with one of the row latches 119. The address stored in a given group of fuses/anti-fuses may be scanned out from the fuse array 125 along the fuse bus 128, and may be latched by a particular row latch 119. In this manner, an address stored in the fuse array 125 may be associated with a particular row of the memory array 118. The address stored in the row latch 119 may then direct access commands to the wordlines associated with the row latch 119.

A fuse logic circuit 126 may be positioned along the fuse bus 128. The fuse logic circuit 126 may include post package repair (PPR) circuits which may be used to make changes to the fuse array 125. For example, the PPR circuits may perform a repair, where fuses in the fuse array are blown to 'repair' a row. The memory 100 may be entered into a PPR mode, and one or more row address RA associated with a defective row of memory may be provided to the fuse logic circuit 126. The fuse logic 126 may scan a fuse array 125 to locate a redundant row that is open (e.g., not used for a repair operation yet), and then the fuse logic 126 may blow fuses of the fuse array 125 to assign the row address RA to that redundant row. For example, the memory banks may have associated PPR controller circuits, which may determine if any of the redundant addresses used for PPR for that bank are available. The PPR controller circuits may send a PPR blow signal to the fuse logic 126 which may then blow the fuses in the fuse array 125 based on those signals. For example, a high voltage may then be applied to the fuse(s) indicated by those signals, which may 'blow' the fuse, changing its state.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line. In some embodiments, the command decoder 106 and address decoder 104 may be coupled together in order for the command decoder 106 to indicate to the address decoder 104 what kind of address(es) to provide. In some embodiments, the command decoder 106 and address decoder may be coupled together through the C/A input circuit 102.

The device 100 may receive an access command which is a row activation command ACT. When the row activation command ACT is received, a bank address BADD and a row address XADD are timely supplied with an internal row activation signal.

The device 100 may receive an access command which is a read command. When a read command is received, a bank address BADD and a column address YADD are timely supplied with the read command, read data is read from memory cells in the memory array 118 corresponding to the row address XADD and column address YADD. For example, the row decoder may access the wordline associated with the row latch 119 which has an address which matches XADD. The read command is received by the command decoder 106, which provides internal commands so that read data from the memory array 118 is provided to the read/write amplifiers 120. The row decoder 108 may match the address XADD to an address stored in a row latch 119, and then may access the physical row associated with that row latch 119. The read data is output to outside from the data terminals DQ via the input/output circuit 122.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. The row decoder 108 may match the address XADD to an address stored in a row latch 119, and then access the physical row associated with that row latch 119. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out an auto-refresh operation. The refresh signal AREF may be a pulse signal which is activated when the command decoder 106 receives a signal which indicates an auto-refresh command. In some embodiments, the auto-refresh command may be externally issued to the memory device 100. In some embodiments, the auto-refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD. The refresh address control circuit 116 may be controlled to change details of the refreshing address RXADD (e.g., how the refresh address is calculated, the timing of the refresh addresses), or may operate based on internal logic. In some embodiments, the refresh address control circuit 116 may perform both auto-refresh operations, where the wordlines of the memory array 118 are refreshed in a sequence, and targeted refresh operations, where specific wordlines of the memory are targeted for a refresh out of sequence from the auto-refresh operations.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

In some embodiments, the normal 'operational' signals of the memory 100 may interfere with the proper operation of the PPR mode. For example, if the memory 100 receives (or improperly generates) an ACT command/row access signal while in a PPR mode (or if the device is accidentally entered into a PPR mode while receiving ACT commands), the ACT commands/signals may cause fuses of the fuse array 125 to be unintentionally blown. This in turn, may cause problems for the proper operation of the memory. The memory 100 may include one or more circuits which may suppress various signals to prevent the ACT commands from leading to inadvertent fuse blowing, as described in more detail herein.

Figure 2:
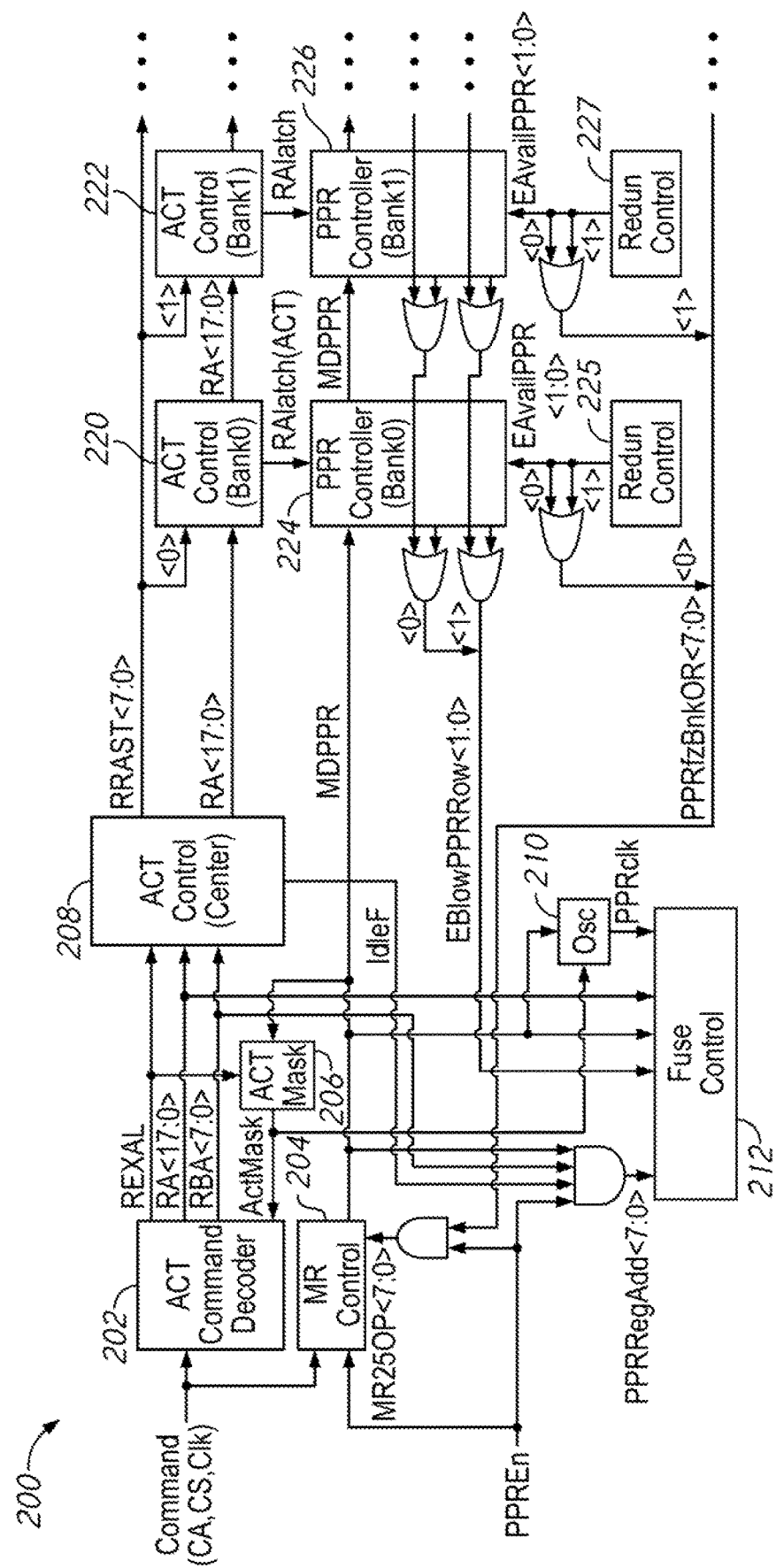
FIG. 2 is a block diagram of a memory with an ACT mask circuit according to some embodiments of the present disclosure.

FIG. 2 is a block diagram of a memory with an ACT mask circuit according to some embodiments of the present disclosure. The memory 200 may, in some embodiments, be included in the memory device 100 of FIG. 1. The memory 200 shows components which may be used in a PPR mode, which may have been omitted in FIG. 1, while conversely certain features and components shown in FIG. 1 may be omitted in FIG. 2. The components of FIG. 2 may be part of components such as command decoder 106 and/or fuse logic 126 of FIG. 1. The example memory 200 shows various signals, which are shown as having a certain number of bits (e.g., 18-bit row address RA<17:0>). However, it should be understood that other lengths the various signals may be used in other embodiments.

The memory 200 includes an ACT command decoder 202 which receives command signals such as CA, CS, and clock signals Clk. The ACT command decoder 202 may determine whether to provide an ACT command as well as providing the addresses associated with that ACT command. For example, the ACT command decoder 202 may provide a signal REXAL, which may be a pulse signal when the signal ACT goes high, as well as row address RA and bank address RBA. These signals may be provided to an ACT control center circuit 208, which may then provide signals to ACT control circuits 220 and 222 associated with the various banks (e.g., Bank0 and Bank1 as shown) as well as to the memory arrays (not shown in FIG. 2).

The command and clock signals (e.g., CA, CS, and Clk) may also be provided to a mode register (MR) control circuit 204. The MR control circuit 204 may manage information stored in mode register via, for example, mode register read and write operations. The MR control circuit 204 may receive a PPR enable signals PPREn (and/or one or more commands) which may cause the MR control circuit 204 to provide a PPR mode signals MDPPR at an active level. The PPR mode signal MDPPR at an active level may indicate that the device is in a PPR mode.

When the device 200 is not in a PPR mode (e.g., MDPPR is inactive), the ACT control center circuit 208 may provide a signal RRAST based on the signals REXAL (e.g., ACT) and RBA to activate one of the bank level ACT control circuits 220 and 222. The ACT control center circuit 208 may also pass along the row address RA, which may cause memory cells in the activated bank to be accessed. The row address RA may be stored in row latches (e.g., 119 of FIG. 1) RAlatch associated with each bank. The ACT control center circuit 208 may provide an idle signal IdleF which is inactive when the device is not idle (e.g., performing at least one action) and active when the device is idle.

In a PPR mode (e.g., when the signal MDPPR is active), commands may be used to retrieve information (e.g., fuse addresses) from the memory array, which may be used to determine which fuses to blow. For example, each bank may be associated with a PPR controller 224 and 226. When activated (e.g., by the address in the RAlatch), the PPR controller may determine if a PPR address is available. In the example embodiment of FIG. 2, there may be two PPR addresses (e.g., 2 redundant rows reserved for PPR) for each of the banks, which may be labelled PPR0 and PPR1. A redundancy control circuit 225 and 227 associated with each of the banks may determine if either of the addresses PPR0 or PPR1 for that bank are available (e.g., so far unused in a PPR operation). The redundancy control circuit 225 and 227 may provide a signal EAvailPPR which may indicate which (if any) of the addresses PPR0 or PPR1 for that bank are available. In some embodiments, the signal EAvailPPR may be a two bit signal, with each bit associated with one of the row addresses PPR0 and PPR1. In some embodiments, the memory may use the first PPR address PPR0 before using the second address PPR1.

The signals EAvailPPR may contribute a bit to an overall availability signal PPRfzBnkOR, which has a bit for each bank (e.g., 8 bits). Each bit of PPRfzBnkOR may be high if either of the PPR fuses associated with that bank are available (e.g., if either bit of EAvailPPR is high for that bank). The signal PPRfzBnkOR may be provided to the MR control circuit 204, and may be combined (e.g., through an AND gate) with the enable signal PPREn to generate a signal MR25OP. This may be used to tell the MR control circuit if an MDPPR mode can be entered.

Various signals may be provided to a fuse control circuit 212, which may blow one or more fuses as part of the PPR operation. For example, an AND gate may combine the signals PPREn, IdleF, RBA, and MDPPR to generate a signal PPRRegAdd. The signal PPRRegAdd may pass the bank address RBA as the signal PPRRegAdd when all of the signals IdleF, PPREn, and MDPPR are active. The fuse control circuit 212 may also receive the fuse blow signal EBlowPPRRow which indicates which PPR address is open, the enable signal MDPPR, and the row address RA. These may be used to blow fuses in the fuse array to redirect the fuse address indicated by EBlowPPRRow associated with the bank indicated by PPRRegAdd to be associated with the address RA. The fuse blow operations may occur with timing based on a clock signal PPRclk, which is generated by an oscillator 210 when the signal MDPPR is active.

The memory 200 may also include an ACT mask circuit 206, which may be used to protect the memory 200 if an ACT signal is activated during PPR operations. The ACT mask circuit 206 may provide a signal ACTmask. When the signal ACTMask is at an active level, the ACT command decoder 202 may be prevented from providing subsequent activations of REXAL (which is a pulse activated in response to ACT). In other words, the signal REXAL may be suppressed, and may not be provided even if subsequent ACT commands are received.

The ACT mask circuit 206 may provide the signal ActMask at an active level when it receives a pulse of REXAL while the signal MDPPR is active. The ActMask circuit 206 may continue to provide the signal ActMask at an active level until the signal PPREn indicates that PPR operations are over. This may prevent pulses of REXAL from being provided, which may prevent ACT commands from causing inadvertent operations during a PPR mode.

In some embodiments, the signal ActMask may also cause the oscillator 210 to start providing the PPR clock signal PPRclk. The fuse logic circuit 212 may perform PPR operations with timing based on the clock signal PPRclk. Accordingly, if the signal PPRclk is not being provided, PPR operations may not be performed. This may add an extra layer of protection, to help prevent PPR operations from being performed until the ACT signals (e.g., REXAL) are properly masked. In this manner, while ActMask is inactive, blowing fuses may be suppressed, to prevent damage (e.g., accidently fuse blowing) due to the accidental activations of REXAL (e.g., ACT).

Figure 3:
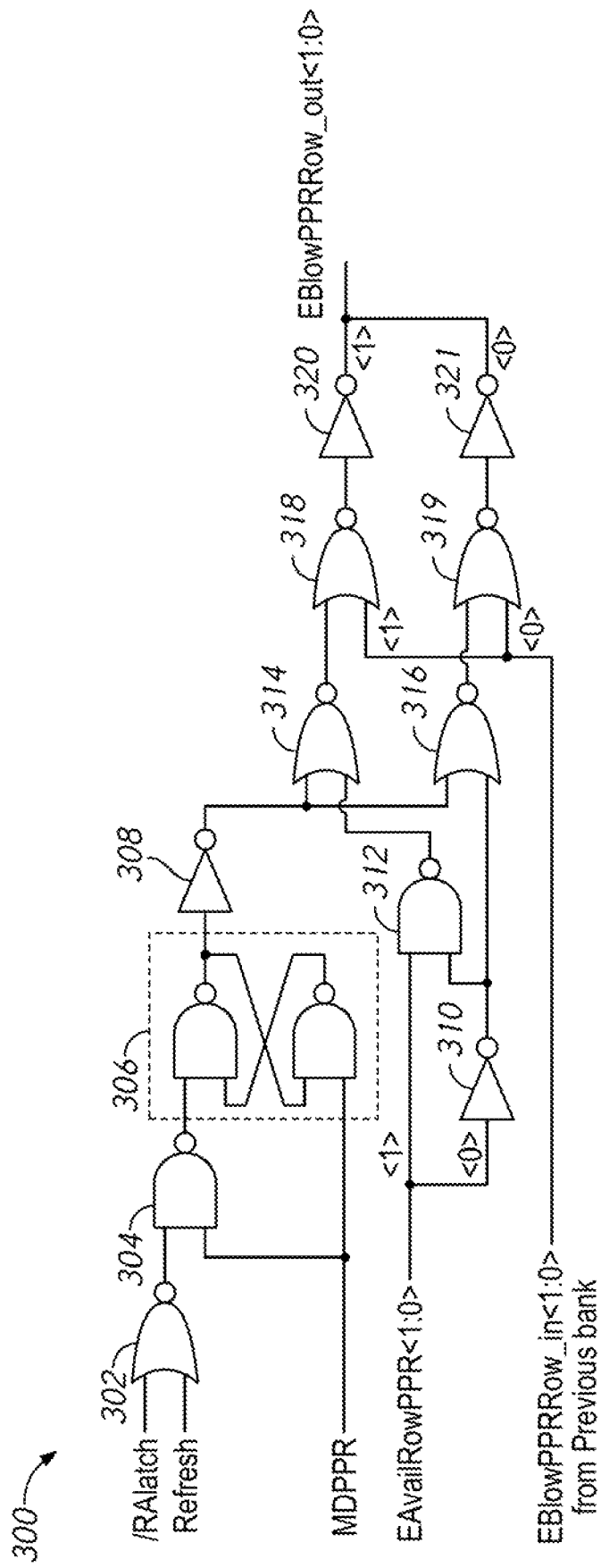
FIG. 3 is a schematic diagram of a PPR controller circuit according to some embodiments of the present disclosure.

FIG. 3 is a schematic diagram of a PPR controller circuit according to some embodiments of the present disclosure. The PPR controller circuit 300 may, in some embodiments, be included in the PPR controller 224 and/or 226 of FIG. 2. There may be a PPR controller 300 associated with each bank of the memory device. The PPR controllers 300 may be coupled together in series. The PPR controller 300 receives a signal EBlowPPRRow_in, which is the signal EBlowPPRRow from a previous PPR controller in the series, and provides a signal EBlowPPRRow_out, which is provided either to a next PPR controller or to a fuse control circuit (e.g., fuse logic circuit 212 of FIG. 2). The first PPR controller in the 'chain' may receive an initial EBlowPPRRow signal to initialize the signal. For example the initial EBlowPPRRow signal may have both bits at a low logical level (e.g., by coupling the EBlowPPRRow_in terminals to a ground voltage such as VSS).

Figure 9:
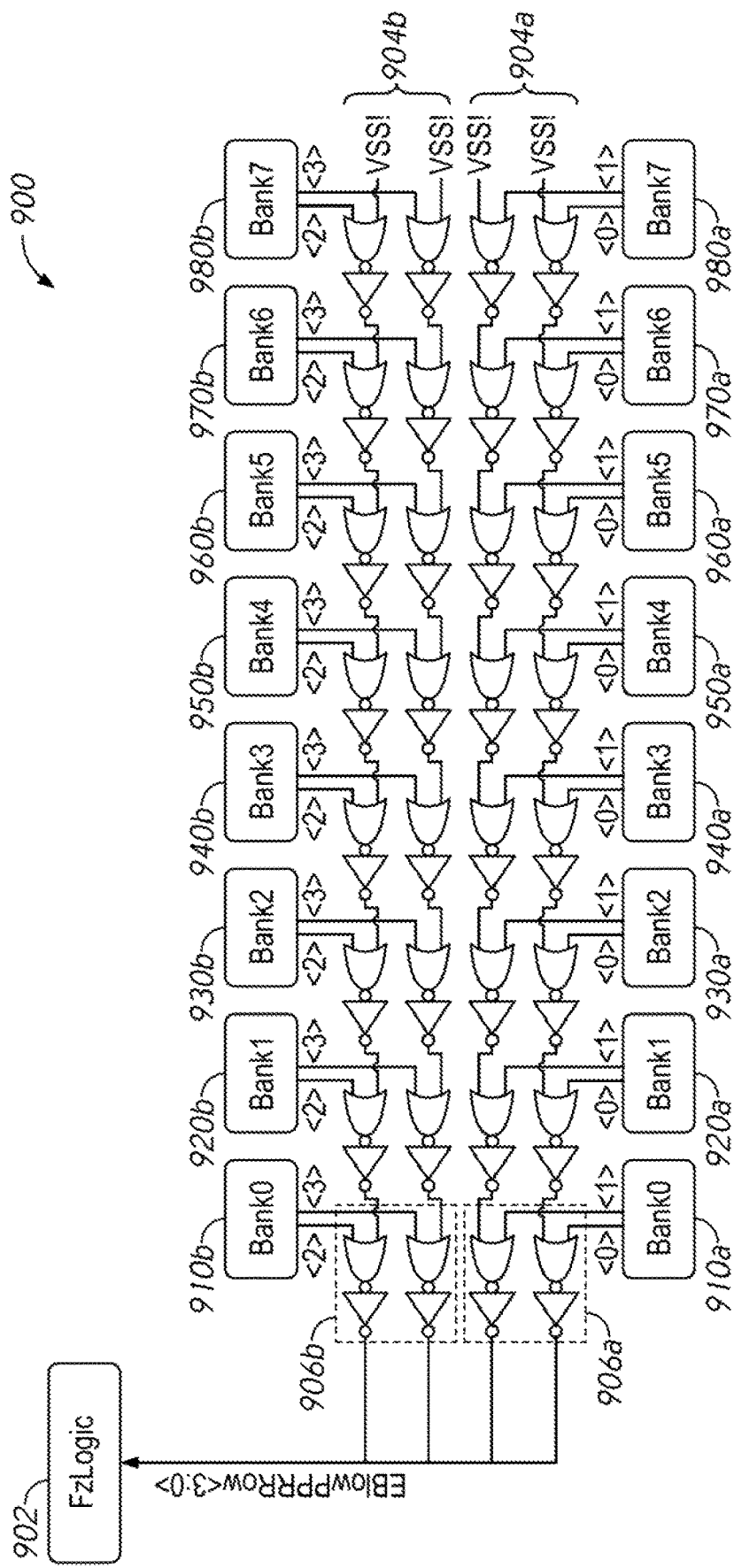
FIG. 9 is a schematic diagram of bank PPR address logic according to some embodiments of the present disclosure.

The PPR controller 300 of FIG. 3 represents an embodiment where each bank has two PPR addresses (e.g., PPR0 and PPR1). The bits of the signal EBlowPPRRow may indicate if either of the two PPR addresses should be blown as part of a PPR operation. By chaining the signals, a single two bit signal may be provided to the fuse logic which along with a signal (e.g., PPRRegAdd) which indicates which bank is active, may allow the fuse logic to use the indicated fuse address as part of a PPR operation. In some embodiments, the signal EBlowPPRRow may include more bits. For example, in some embodiments there may be more PPR addresses per bank, and therefore more bits of the EBlowPPRRow signal. FIG. 9 describes an alternate PPR controller circuit of such an example embodiment in more detail, where each bank is divided into two regions, each of which has two PPR addresses, and the EBlowPPRRow signal has four bits.

The PPR controller 300 receives a signal /RAlatch and Refresh from an ACT control circuit (e.g., 220 of FIG. 2). These signals may indicate if the bank is active, and if the bank has been activated to perform a refresh operation, respectively. The signal /RAlatch is provided as a negative pulse (e.g., high, low, high) if the bank associated with the PPR controller 300 is active. The signal Refresh is high if the associated bank is undergoing a refresh operation, and low otherwise. The two signals are used as inputs to a NOR gate 302, which provides an output which is high only if the signals /RAlatch and Refresh are low (e.g., the bank is active but not refreshing). The output of the NOR gate 302 is provided to an input terminal of a NAND gate 304, which has another input coupled to the signal MDPPR, which indicates if the device is in a PPR mode. The NAND gate 304 provides a signal to an input of a latch circuit 306, which may be a pair of cross-coupled NAND gates. The latch 306 also has a reset terminal coupled to the signal MDPPR. The latch 306 therefore stores a low logical value only if the signals /RAlatch and Refresh are low, but the signal MDPPR is high, indicating that the associated bank is active (but not refreshing) and the device is in a PPR mode.

The latch outputs its stored value through an inverter 308 to the inputs of two NOR gates 314 and 316. The output of the inverter 308 will be high when latch 306 is storing a low logical value. The other inputs of the NOR gates 314 and 316 are coupled to bits of a signal EAvailRowPPR, which indicates if the PPR addresses associated with that bank are available or not (e.g., from redundancy control circuit 225 of FIG. 2). In particular, the NOR gate 316 is coupled through an inverter 310 to a first bit (e.g., EAvailRowPPR<0>) of the signal, while the input of the NOR gate 314 is coupled to the output of a NAND gate 312. The NAND gate 312 has the second bit of EAvailRowPPR (e.g., EAvailRowPPR<1>) and the inverted first bit (e.g., from inverter 310) as inputs. The output of the NAND gate 312 is only low if the second bit of EAvailRowPPR is high, and if the first bit is low (e.g., EAvailRowPPR=<0,1>).

The output of the first NOR gate 316 is a low logical value if either of the inputs (e.g., from the inverter 308 or from the inverter 310) is high. Accordingly, the first NOR gate 316 provides a low logical value if the associated bank is active (but not refreshing) and in a PPR mode, or if the first PPR address is available (e.g., EAvailRowPPR is low). The second NOR gate 314 provides a low logical level if the associated bank is active (but not refreshing) and in a PPR mode, or if the second PPR address is available (e.g., the output of NAND gate 312 is high).

The outputs of the NOR gates 316 and 314 are provided as inputs to NOR gates 319 and 318 respectively. The other input of the NOR gate 319 is coupled to the first bit of EBlowPPRRow_in, and the other input of the NOR gate 318 is coupled to the second bit of EBlowPPRRow_in. The outputs of the NOR gates 318 and 319 are coupled through inverters 320 and 321 respectively, to form the bits of the output signal EBlowPPRRow_out. Accordingly, each bit of EBlowPPRRow_out may be high if the associated bit of EBlowPPRRow_in was high, or if the current bank is activated as part of a PPR mode and one of the PPR addresses is available.

Figure 4:
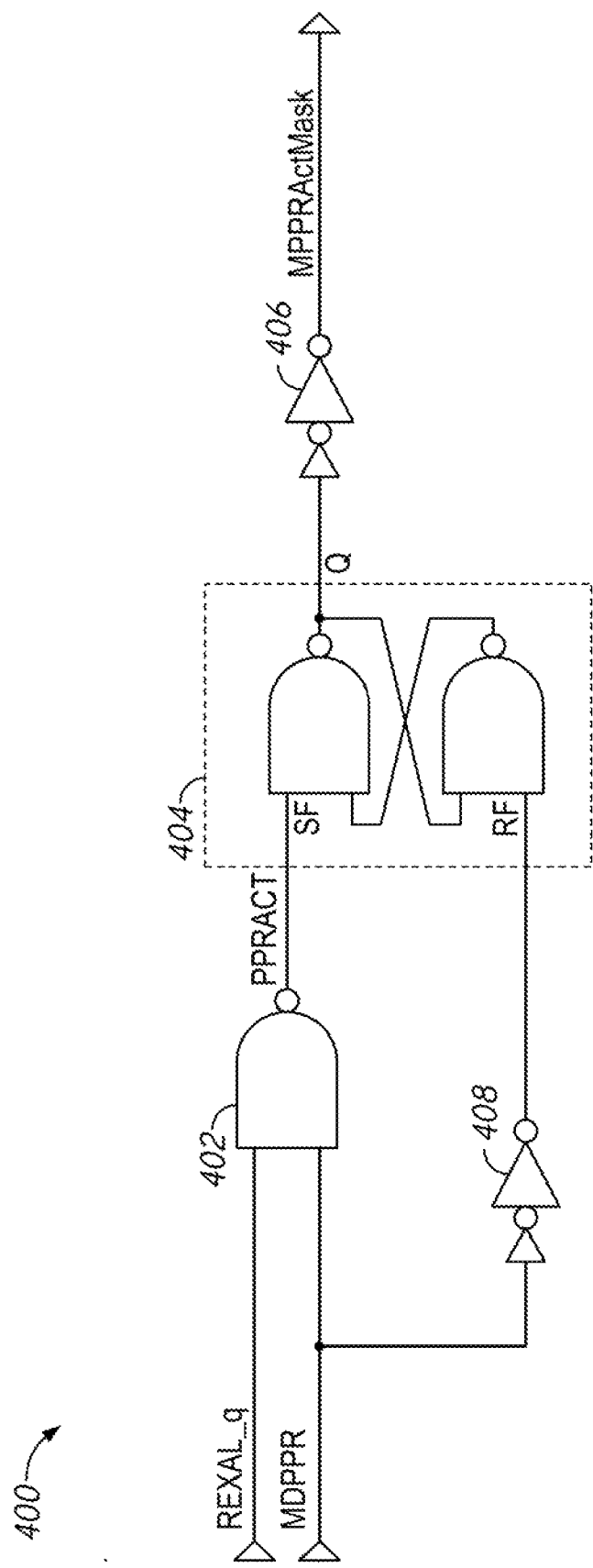
FIG. 4 is a schematic diagram of a PPR ACT mask circuit according to some embodiments of the disclosure.

FIG. 4 is a schematic diagram of a PPR ACT mask circuit according to some embodiments of the disclosure. The circuit 400 may, in some embodiments, be included in the Act mask circuit 206 of FIG. 2. The Act mask circuit 400 may provide the signal MPPRActMask (e.g., ACTMask of FIG. 2) which may suppress operations while the device is in PPR mode.

The Act mask circuit 400 includes a NAND gate 402 which receives the signals REXAL (which is a pulse based on the signal ACT) and the PPR mode signal MDPPR. When both the signals REXAL and MDPPR are active (e.g., an illegal ACT signal during a PPR mode) the NAND gate 402 provides a signal PPRACT at a low level to an input terminal Sf of a latch 404. In some embodiments, the latch 404 may include two cross-coupled NAND gates. When PPRACT is stored at a low level by the latch 404, the output terminal Q of the latch 404 may provide a high signal to a buffer 406, which may in turn provide the signal MPPRActMask at a high (e.g., active level). When the signal PPRACT is at a high level (e.g., indicating that at least one of REXAL and MDPPR is inactive) and the signal MDPPR is at a low level then the latch may store a low value and MPPRActMask may be at a low level.

The ACT mask circuit 400 may continue to provide the signal MPPRActMask until reset. The reset terminal of the latch 404 is coupled through a buffer 408 to the signal MDPPR. The buffer 408 may help to reduce noise in the reset terminal Rf of the latch 404. In some embodiments, the buffer 408 may be omitted. When MDPPR falls to a low level, the buffer 408 provides a low signal to the reset terminal Rf of the latch 404, which may cause the latch 404 to reset, which in turn causes the signal MPPRActMask to return to a low logical level (e.g., inactive).

Figure 5:
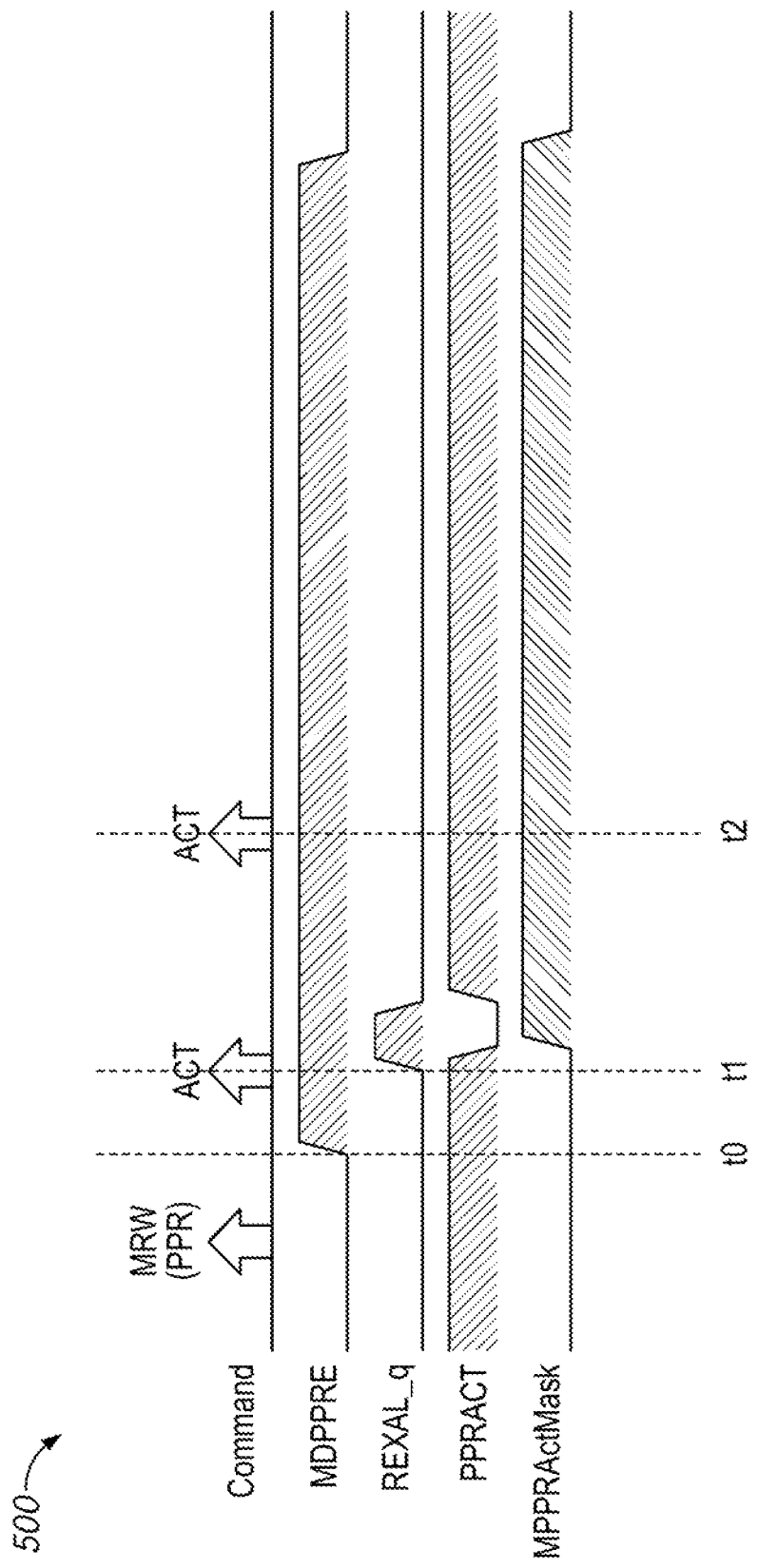
FIG. 5 is a timing diagram of operations of PPR Act Mask circuit according to some embodiments of the current disclosure.

FIG. 5 is a timing diagram of operations of PPR Act Mask circuit according to some embodiments of the current disclosure. The timing diagram 500 may, in some embodiments, represent the operation of an ACT mask circuit such as 206 of FIG. 2 and/or 400 of FIG. 4.

The timing diagram 500 shows a command bus, with arrows to represent the different commands which are received (e.g., at a C/A terminal such as the one in FIG. 1). The timing diagram 500 also shows binary signals such as the internal PPR mode signal MDPPRE, the ACT based pulse REXAL, the PPRACT signal (e.g., which is internal to the ACT mask circuit 400 of FIG. 4), and the PPR ACT mask signal MPPRActMask.

At an initial time t0, the memory device may receive a mode register write (MRW) signal which indicates an entry into the PPR mode. This may cause the PPR mode signal MDPPRE to rise to an active level. At a first time t1, the device may receive (or may generate internally) an ACT command. The ACT command at t1 causes a pulse of the signal REXAL to be generated. Accordingly, since both MDPPRE and REXAL are active (e.g., at a high level), the signal PPRACT may fall to a low logical level, which in turn may be saved in a latch (e.g., 404) of a PPR Act mask circuit, causing the signal MPPRActMask to rise to an active (e.g., high) logical level. In some embodiments, the first ACT command at t1 may provide the row address data which is intended to be repaired by the PPR operation.

At a time t2, a second ACT signal may be received as a command. This command may be illegal since only one ACT command is allowed, and there was already at an ACT command at t1. However, in this case since the signal MPPRActMask is active, the command decoder (e.g., 202 of FIG. 2) does not provide a pulse of REXAL. With no pulse of REXAL, no erroneous fuses are blown. In this manner, the blowing of inadvertent fuses may be limited to a single illegal ACT command while subsequent ACT commands are masked. For example, if the first ACT is a legal command, then the second ACT is masked and no fuses are inadvertently blown. In some embodiments, the device may have been entered into a PPR mode in error, and both ACT commands may be illegal, in which case only the ACT at t1 results in inadvertent blown fuses. At a later time, when the device finishes PPR operations, the signal MDPPRE may fall to a low level, which may reset the signal MPPRActMask to a low level.

Figure 6C:
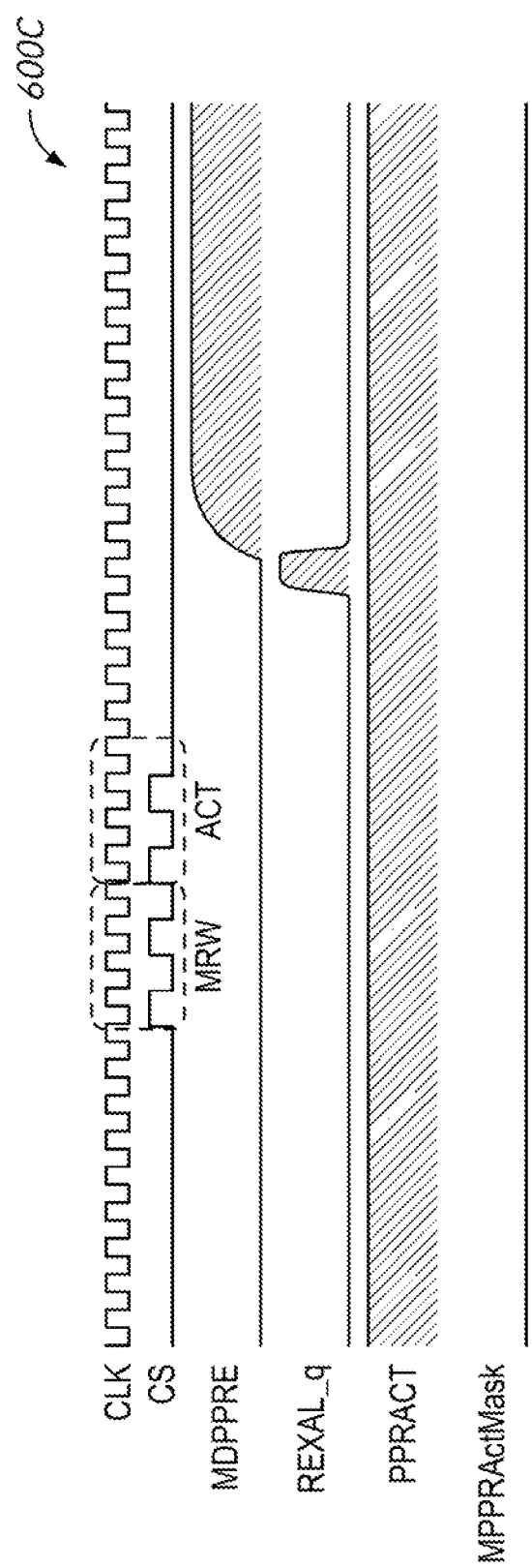

FIGS. 6A-6C are timing diagrams of modeling the timing of various signals involved with a PPR Act Mask circuit according to some embodiments of the present disclosure. The timing diagrams may, in some embodiments, represent the operations of an ACT mask circuit such as 206 of FIG. 2 and/or 400 of FIG. 4. The timing diagrams 600a-c may show scenarios which are generally similar to the idealized timing diagram 500 of FIG. 5, however in the diagrams 600a-c different circuit conditions are modeled which may affect the timings of the various signals. While certain voltages, and certain rates and durations of signals are shown in FIGS. 6A-6C, these are for illustrative purposes only, and other voltages and timings may be used in other example embodiments.

FIG. 6A shows a timing diagram 600a with behavior similar to that shown in FIG. 5. A command to enter a PPR mode is received at an initial time t0, followed by an ACT command at t1. Unlike FIG. 5, in FIG. 6A, the ACT command is received before the signal MDPPRE rises to an active level. However, the signal MDPPRE does rise to a high level before the pulse REXAL is provided, and so mask signal MPPRActMask properly activates.

FIG. 6B shows a timing diagram 600b which shows a scenario where the command pulses for MRW (e.g., PPR entry) and ACT are shortened, which may lead to closer timing between MDPPRE and REXAL. In the timing diagram 600b, the signal MDPPRE and REXAL begin rising to a high level at roughly the same time, however MDPPRE rises more slowly than REXAL. However, the ACT mask circuit still correctly identifies the signals MDPPRE and REXAL as active at the same time, and the signal MPPRActMask is properly raised to a high level.

FIG. 6C shows a timing diagram 600c which represents a memory condition in which the signal MPPRActMask fails to activate properly. In particular, the timing diagram 600c shows a memory being operated outside of normal specification. For example, a system voltage, such as VPERI may be below a normal specification voltage. This may cause various operations to occur more slowly than normal. In the timing diagram 600c, although the command MRW (e.g., PPR entry) is received before the signal ACT, the signal MDPPRE does not begin to rise to a high level until after the pulse REXAL. Accordingly, the signal MPPRActMask does not rise to a high level, and subsequent ACT signals (e.g., subsequent pulses of REXAL) will not be masked.

In some embodiments, the memory may use the activation of multiple signals to activate further masking signals (and/or other methods of disabling PPR operations) to offer further protection (e.g., in scenarios similar to those discussed in FIG. 6C). In some embodiments, these may be in addition to the ACT mask circuit.

Figure 7:
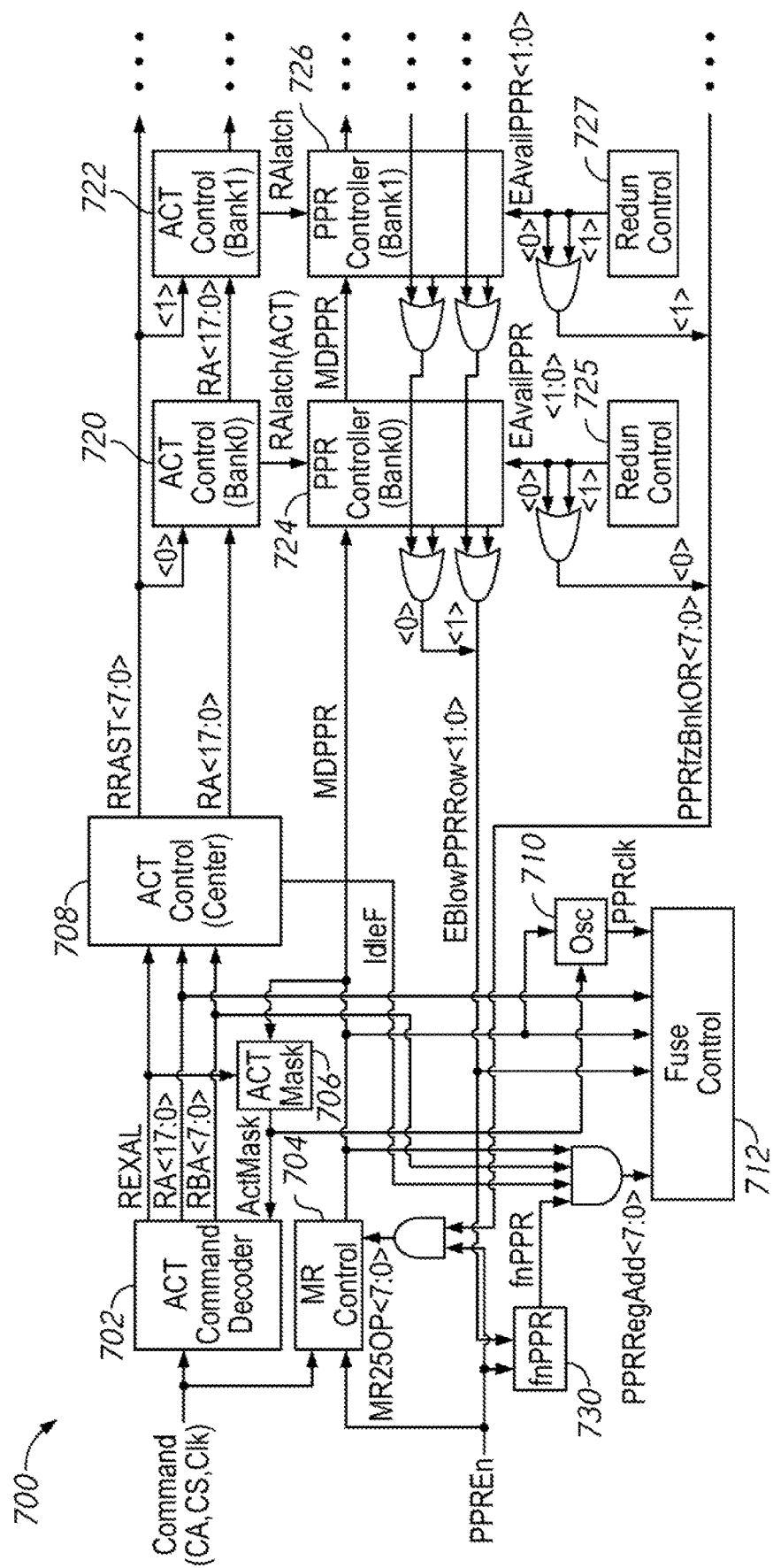
FIG. 7 is a block diagram of a memory device according to some embodiments of the present disclosure.

FIG. 7 is a block diagram of a memory device according to some embodiments of the present disclosure. The memory device 700 may, in some embodiments, be included in the memory device 100 of FIG. 1. The memory device 700 may be generally similar to the memory device 200 of FIG. 2, except that the memory device 700 includes an additional PPR function circuit 730 which may disable PPR operations when an illegal combination of PPR signals is indicated. For the sake of brevity, features and operations of the memory device 700 similar to those described with respect to the memory device 200 of FIG. 2 will not be described again.

The memory device 730 includes a PPR function circuit 730 which receives the EBlowPPRRow signal, which is a multi-bit signal with bits which indicate which PPR addresses are available for use. The PPR function circuit 730 provides a signal fnPPR, which may be used to suppress operations (e.g., blowing of fuses) of the fuse control circuit 712 when the status of the signal EBlowPPRRow represents an illegal operation. The signal fnPPR may normally be activated by the signal PPREn, and while the signal fnPPR is active (e.g., at a high logical level), PPR operations may continue. When the PPR function circuit 730 detects an illegal operation (e.g., an illegal state of one or more signals), the signal fnPPR may be provided at an inactive level (e.g., a low logical level) which may halt PPR operations (e.g., by suppressing one or more signals).

An example illegal operation may be the scenario discussed in FIG. 6C, where the signal MPPRActMask fails to properly activate after a first ACT signal, and only activates after a second ACT signal. In such a scenario, the two ACT signals may cause improper operations, which may generate an illegal status of one or more of the internal PPR signals. For example, under normal PPR operations, both bits of EBlowPPRRow are not at a high logical level at the same time. However, in scenarios where more than one ACT signal is received in a PPR mode, both bits of EBlowPPR-Row may end up active. The PPR function circuit 730 may use this (and/or other patterns of signal activation) to determine that a PPR operation is in an illegal state. When the PPR function circuit 730 determines an illegal operation, the signal fnPPR may be switched to an inactive level.

Figure 8:
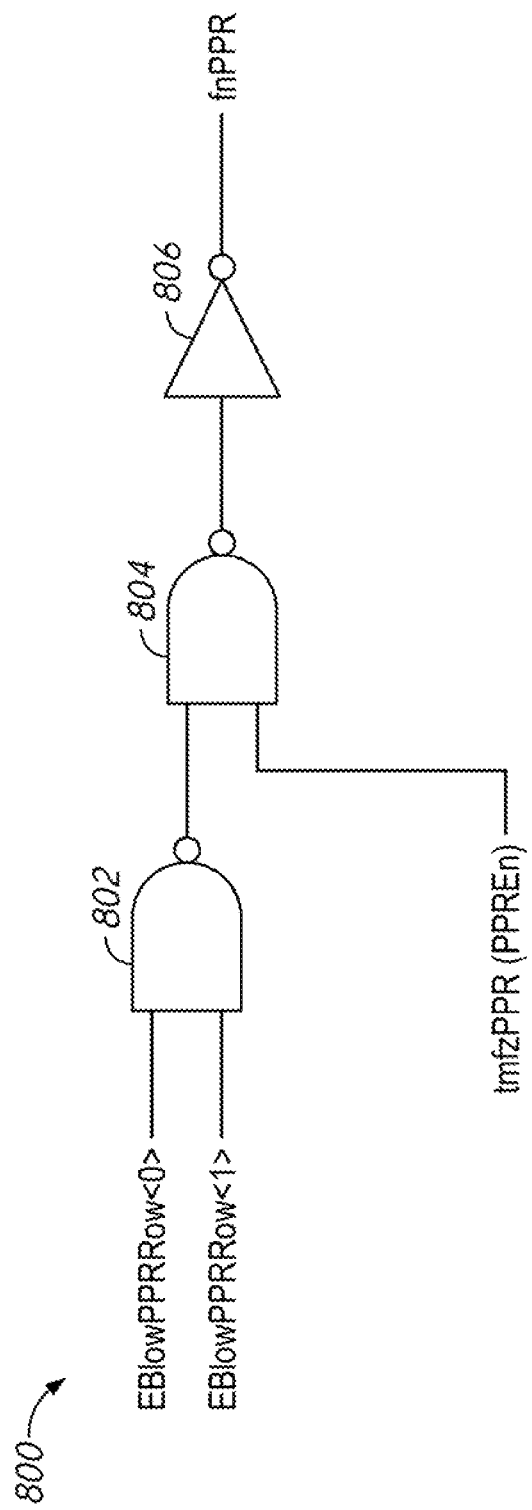
FIG. 8 is a schematic diagram of a PPR function circuit according to some embodiments of the present disclosure.

As an example of how the signal fnPPR may be used to suppress operations, in the example embodiment of FIG. 8, the signal fnPPR is provided to an AND gate along with the signals IdleF, RBA, and MDPPR. Accordingly, only when all three of fnPPR, IdleF, and MDPPR are active is the signal RBA passed as the signal PPRRegAdd. If the signal fnPPR is inactive, then the signal PPRRegAdd may be inactive (e.g., all bits at a low level) and the fuse control circuit 712 may not perform any actions. Other methods of suppressing PPR operations may be used in other example embodiments.

FIG. 8 is a schematic diagram of a PPR function circuit according to some embodiments of the present disclosure. The PPR function circuit 800 may, in some embodiments, be included in the PPR function circuit 730 of FIG. 7.

The PPR function circuit 800 includes a NAND gate 802 which has input terminals coupled to each bit of EBlowP-PRRow. Accordingly, if both bits of EBlowPPRRow are high (e.g., an illegal state of the signal), then the NAND gate outputs a low logical level. The output of the NAND gate 802 is provided to an input terminal of a second NAND gate which is coupled to PPREn. If either (or both) of the inputs of the second NAND gate 804 is at a low logical level, then the output of the second NAND gate 804 is high, which is passed through an inverter 806 to provide the signal fnPPR. Accordingly, the signal fnPPR is high if PPREn is high and if at least one of the bits of EBlowPPRRow is low. If both bits of EBlowPPRRow are high (or if PPREn is low) then the signal fnPPR is at a low level.

Figure 10:
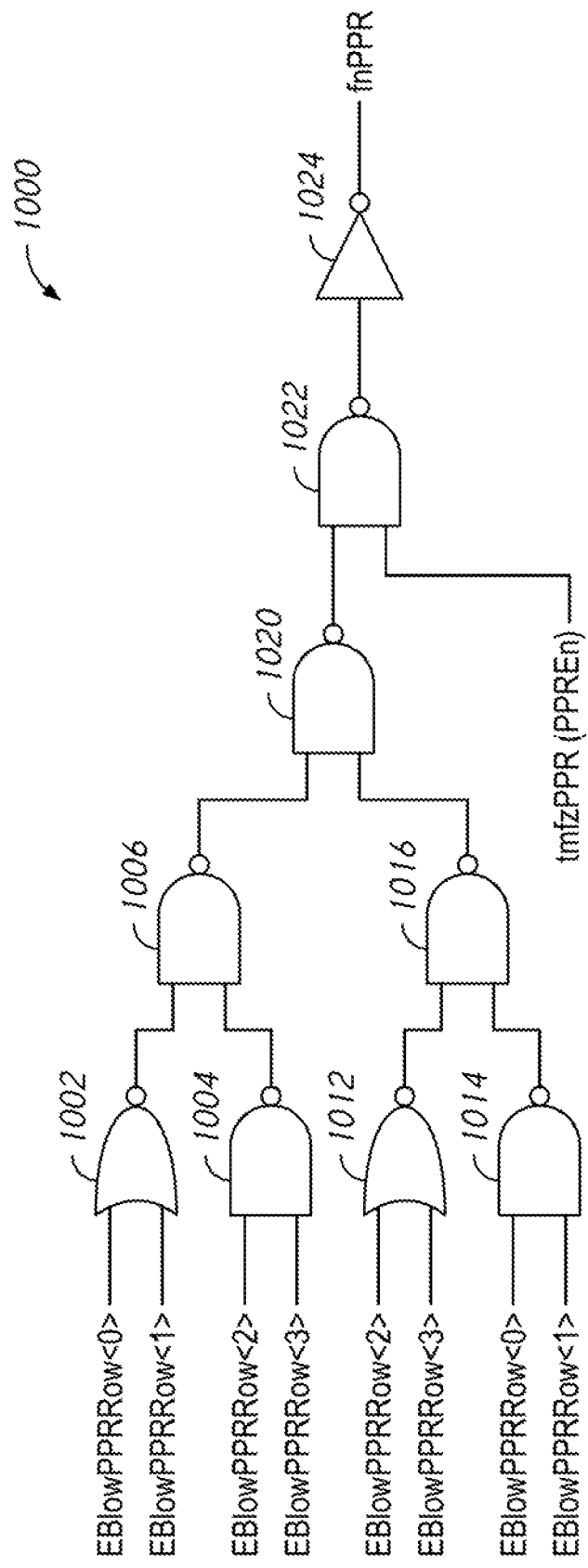
FIG. 10 is a schematic diagram of a PPR function circuit according to some embodiments of the present disclosure.
Figure 11:
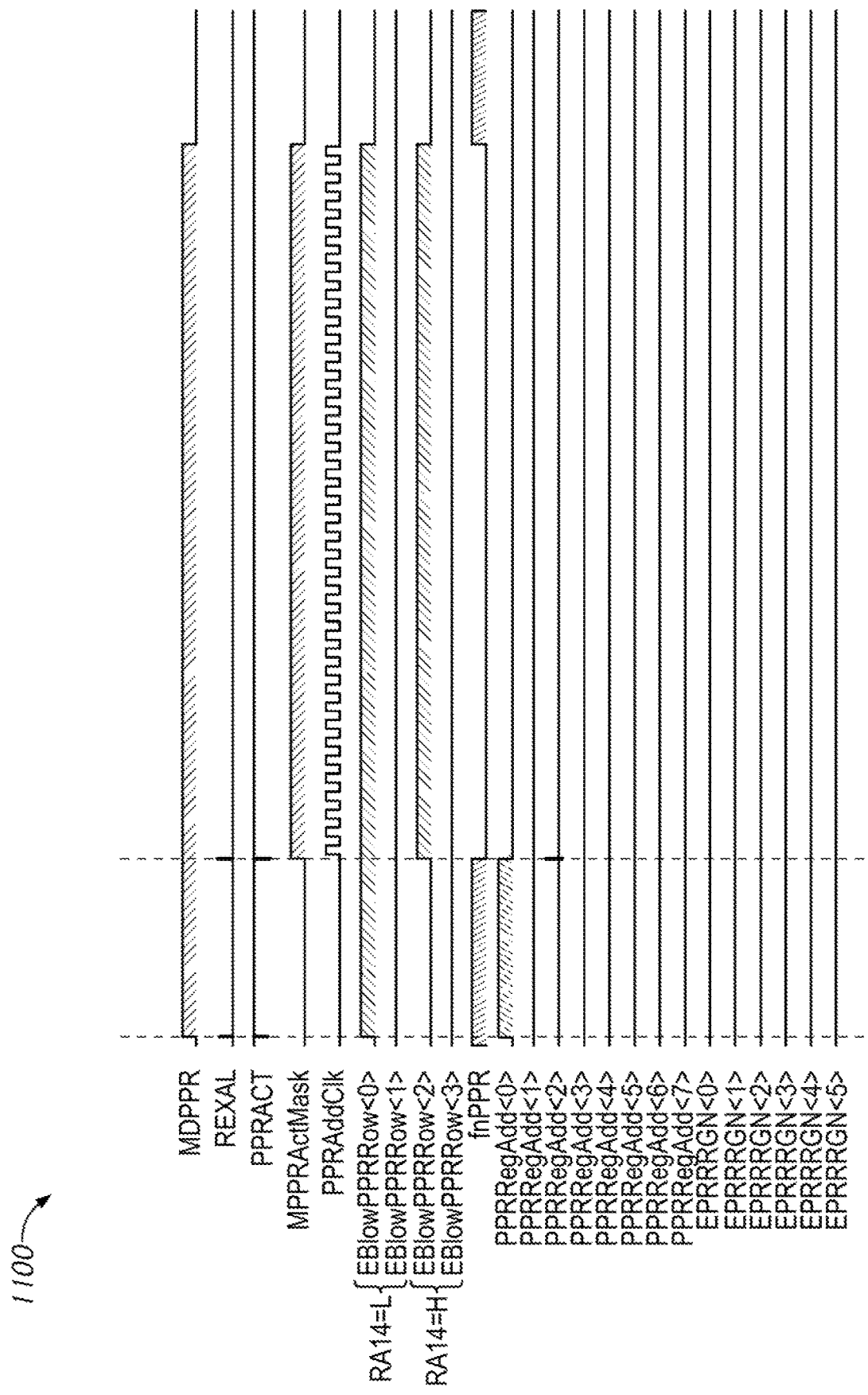
FIG. 11 is a timing diagram of signals of a memory device with a PPR function circuit, according to some embodiments of the present disclosure.

In some embodiments, the memory may include more than one PPR address per bank, and the signal EBlowPPR-Row may have more than two bits. FIGS. 9-11 describe such an embodiment, and example modifications to the PPR controllers and PPR function circuit which accommodate the increased number of bits of EBlowPPRRow. Such embodiments may also include PPR Act mask circuits (e.g., 206 of FIG. 2).

FIG. 9 is a schematic diagram of bank PPR address logic according to some embodiments of the present disclosure. The bank PPR address logic 900 may, in some embodiments, be analogous to the PPR controllers 224 and 226 of FIG. 2 and/or the PPR controller 300 of FIG. 3. The bank PPR address logic 900 shows a set of banks 910-980, each of which is divided into two regions (e.g., 910a and 910b). For example, the two regions of a bank may be on opposite sides of a central region of a memory die. The different regions of a bank may be accessed based on a portion of the row address. For example, in the embodiment of FIG. 9, the 13th bit of the row address (X13) may be used to determine which region is accessed. Other ways of directing operations between the banks may be used in other embodiments.

Each bank may have four PPR addresses, two associated with each region of the bank. For example, the first region 910a of Bank0 is associated with addresses PPR0 and PPR1, while the second region 910b of Bank0 is associated with addresses PPR2 and PPR3. The bank PPR address logic 900 provides a signal EBlowPPRRow, which is a multi-bit signal that represents which of the four PPR addresses are available for the active bank. Each region of each bank provides a PPR availability signal (e.g., analogous to EAvailRowPPR of FIGS. 2-3) which indicates if the two PPR addresses of that region are available.

Similar to the PPR controllers previously discussed in relation to FIG. 3, the PPR controllers of FIG. 9 are chained together in series with logic series 904a and 904b. However, unlike FIG. 3, in FIG. 9 there are two such chains, a first logic series 904a which couples the signals for all of the first regions (e.g., 910a-980a) and a second logic series 904b for the second regions (e.g., 910b-980b). Each logic series 904a-b receives the availability signals from the banks of that region, and provides a portion of the an overall PPR blow signal EBlowPPRRow. For example, logic series 904a provides a first and second bit of the signal EBlowPPRRow, while logic series 904b provides a third and fourth bit of the signal EBlowPPRRow.

Each region of each bank may be coupled to PPR controller 906a or 906b, which may be coupled in series to form the logic series 904a or 904b respectively. The PPR controllers 906a or 906b may be generally analogous to the PPR controller 300 of FIG. 3. Since they may be generally similar, only a single PPR controller 906a will be discussed in detail. The PPR controller 906a receives a pair of input bits from previous PPR controllers of the logic chain 904a. The PPR controller 906a is also coupled to availability signals from the associated bank 910a. Each bit of the availability signals may be active if the associated PPR address for that bank region 910a is ready to be blown, and at a low logical level if the PPR address is not ready to be blown (e.g., because it is already in use).

Each PPR controller 906a may include logic gates, which may be used to generate the signal EBlowPPRRow_out based on EBlowPPRRow_in and the availability bits from the associated bank. For simplicity of illustration, in FIG. 9, only a single NOR gate and inverter (e.g., an OR gate) is shown for each bit of the signal, with the signal EBlowP-PRRow_out high if either the previous bit EBlowPPR-Row_in or the availability signal from the associated bank is high. While additional functionality is not shown in FIG. 9, in some embodiments, the PPR controllers 906a may include one or more functions of the PPR controller 300 of FIG. 3. For example, the PPR controller 906a may also take into account signals such as/RAlatch, Refresh, and/or MDPPR.

Similar to the priority between addresses discussed in regards to FIG. 3, in FIG. 9, PPR addresses may be used in a certain sequence. In particular, the address PPR0 may be blown before the address PPR1 is used for a given bank's first region, and the address PPR2 may be blown before the address PPR3 is used for a given bank's second region. Since only one of the four addresses may be blown at a time, more than one bit from a given bank region being high (e.g., both bits 0 and 1, both bits 2 and 3, bit 0 and 2) may represent an illegal operation.

FIG. 10 is a schematic diagram of a PPR function circuit according to some embodiments of the present disclosure. The PPR function circuit 1000 may, in some embodiments, be included in the PPR function circuit 730 of FIG. 7. The PPR function circuit 1000 may be analogous to the PPR function circuit 800 of FIG. 8, except the PPR function circuit 1000 operates in an embodiment, such as the one discussed in regards in FIG. 9, where there are four bits of the EBlowPPRRow signal, representing two pairs of PPR addresses, each associated with on region of a bank.

The PPR function circuit 1000 includes a NOR gate 1002 with input terminals coupled to EBlowPPRRow<0> and EBlowPPRRow<1>, and a NAND gate 1004 with input terminals coupled to EBlowPPRRow<2> and EBlowPPRRow<3>. The outputs of the NOR gate 1002 and NAND gate 1006 are provided to the input terminals of a NAND gate. The NOR gate 1002 provides a high logical value only when Both EBlowPPRRow<0> and EBlowPPRRow<1> are low, and provides a low logical value if either of them is high. The NAND gate 1004 provides a low logical value only if both EBlowPPRRow<2> and EBlowPPRRow<3> are high and provides a high logical value if at least one of those signals is low. The NAND gate 1006 provides a low value only when both inputs are high. Accordingly, the NAND gate 1006 provides a low value only when at least one of EBlowPPRRow<2> and EBlowPPRROw<3> are low, and when both EBlowPPRRow<0> and EBlowPPRRow<1> are low.

The PPR function circuit 1000 also includes NOR gate 1012, NAND gate 1014, and NAND gate 1016 which function in an analogous fashion to the gates 1002, 1004, and 1006 respectively. However, the NORgate 1012 is coupled to EBlowPPRRow<2> and EBlowPPRRow<3>, while the NAND gate 1014 is coupled to EBlowPPRRow<0> and EBlowPPRRow<1>. Accordingly, the output of the NAND gate 1016 is only low when at least one of EBlowPPRRow<0> and EBlowPPRRow<1> are low, and when both EBlowPPRRow<2> and EblowPPRRow<3> are low.

The output terminals of the NAND gates 1006 and 1016 are provided to NAND gate 1020. The output of the NAND gate 1020 is low only when the two NAND gates 1006 and 1016 are providing high logical outputs. The output of the NAND gate 1020 is provided to a NAND gate 1022, which is also coupled to the signal PPREn. The output of the NAND gate 1022 is provided through an inverter 1024 to provide the signal fnPPR. Accordingly, for fnPPR to be high, PPREn must be at a high logical level, and the neither EBlowPPRRow<2> and EBlowPPRRow<3> nor EBlowPPRRow<0> and EBlowPPRRow<1> can both be high. In addition, for fnPPR to be high only one of the pairs (one of EBlowPPRRow<0>/EBlowPPRRow<1> or one of EBlowPPRRow<2>/EBlowPPRRow<3>) can be active at once.

FIG. 11 is a timing diagram of signals of a memory device with a PPR function circuit, according to some embodiments of the present disclosure. The timing diagram 1100 may, in some embodiments, represent signals in a memory such as 700 of FIG. 7. The timing diagram 1100 shows a waveforms which may be produced under the conditions discussed with regards to FIG. 6C, namely a situation in which the signal MPPRActMask fails to properly activate responsive to a pulse of REXAL (e.g., ACT) when MDPPR is active. However, in the timing diagram 1100, the memory includes an additional PPR function circuit (e.g., 730 of FIG. 7) which may be used to suppress PPR operations.

At an initial time t0, the memory enters a PPR mode and the signal MDPPR rises to a high level. At the initial time, the memory also receives an ACT command, which causes a pulse of the signal REXAL. However, due to improper behavior (e.g., out of specification voltages), the signal MPPRActMask may improperly remain at a low level. Responsive to the ACT command, the signal EBlowPPRow<0> may become active, to indicate that the first fuse address (e.g., PPR0) should be blown. This in turn activates the signal PPRRegAdd<0>. However, since the signal MPPRActMask is at a low level, the PPR clock signal (e.g., provided by oscillator 710 of FIG. 7) may remain inactive.

At a first time t1, the memory may receive another ACT command and provide a second pulse of the signal REXAL. Since this pulse of REXAL is well after MDPPR became active at the initial time t0, the signal MDPPRActMask may become active, and that in turn may activate the oscillator to begin providing the signal PPRAddClk. This pulse of REXAL may also cause the signal EBlowPPRRow<2> to become active.

Both EBlowPPRRow<0> and EBlowPPRRow<2> being active at the same time may cause the PPR function circuit to drop the signal fnPPR to an inactive level. This in turn may suppress the PPRRegAdd signals (e.g., as seen by PPRRegAdd<0> dropping to a low level). Since no PPRRegAdd signals can be active while fnPPR is inactive, the PPR operation may be suppressed. At a later time, when the signal MDPPR falls to a low level, the circuit may reset, and fnPPR may return to a high logical level.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims

What is claimed is:

1. An apparatus comprising:
a command decoder configured to provide a row activation signal responsive to a row activation command; and
a mask circuit configured to receive the row activation signal and further configured to provide a mask signal at an active level when the row activation signal is received while the apparatus is in a post-package repair (PPR) mode, wherein the command decoder is further configured to not provide the row activation signal when the mask signal is active, wherein the mask signal remains active until the PPR mode is exited.

2. The apparatus of claim 1, further comprising a mode control circuit configured to provide a PPR mode signal at an active level responsive to the apparatus being in the PPR mode, wherein the mask circuit is configured to provide the mask signal at an active level responsive to receiving the row activation signal while the PPR mode signal is active.

3. The apparatus of claim 1, further comprising an oscillator circuit configured to provide a PPR clock signal responsive to the mask signal being active.

4. The apparatus of claim 3, wherein PPR operations are performed based, in part, on the PPR clock signal.

5. An apparatus comprising:
a command decoder configured to provide a row activation signal responsive to a row activation command;
a mask circuit configured to provide a mask signal at an active level when the row activation signal is received while the apparatus is in a post-package repair (PPR) mode, wherein the command decoder is further configured to not provide the row activation signal when the mask signal is active, wherein the mask signal remains active until the PPR mode is exited; and
a PPR function circuit configured to provide a PPR function signal at an active level when the device is in the PPR mode, wherein PPR operations are performed when the PPR function signal is at the active level, and wherein the PPR function circuit is further configured to determine a state of a PPR fuse signal and provide the PPR function signal at an inactive level if the state of the PPR fuse signal represents an illegal operation, and wherein the PPR fuse signal comprises a multi-bit signal, and wherein the illegal operation is determined based on multiple bits of the multi-bit signal being at a high logical level at the same time.

6. The apparatus of claim 5, wherein the command decoder is configured to provide a memory bank address, and wherein responsive to the PPR function signal at the inactive level, the memory bank address is suppressed by the PPR function circuit.

7. An apparatus comprising:
a memory bank comprising a word line associated with a row address and a redundant word line;
a fuse logic circuit configured to blow one or more fuses to remap the row address to the redundant word line as part of a post-package repair (PPR) operation performed when the apparatus is in a PPR mode;
a PPR mask circuit configured to receive the row activation signal and further configured to provide a PPR mask signal at an active level responsive to receiving the row activation signal while the apparatus is in the PPR mode; and
a command decoder configured to receive a row activation command and provide a row activation signal when the apparatus is not in the PPR mode, and further configured to not provide the row activation signal when the apparatus is in the PPR mode, wherein responsive to the PPR mask signal at the active level, the command decoder is configured to suppress the row activation signal, and wherein the PPR mask signal remains active until the apparatus exits the PPR mode.

8. The apparatus of claim 7, wherein the PPR mask circuit is configured to be reset and provide the PPR mask signal at an inactive level responsive to the apparatus exiting the PPR mode.

9. The apparatus of claim 7, further comprising a PPR controller associated with the memory bank, wherein the PPR controller is configured to provide a PPR blow signal with a state which indicates if the redundant word line is ready to be used.

10. An apparatus comprising:
a memory bank comprising a word line associated with a row address and a redundant word line;
a fuse logic circuit configured to blow one or more fuses to remap the row address to the redundant word line as part of a post-package repair (PPR) operation performed when the apparatus is in a PPR mode;
a PPR mask circuit configured to provide a PPR mask signal at an active level responsive to receiving the row activation signal while the apparatus is in the PPR mode;
a command decoder configured to receive a row activation command and provide a row activation signal when the apparatus is not in the PPR mode, and further configured to not provide the row activation signal when the apparatus is in the PPR mode, wherein responsive to the PPR mask signal at the active level, the command decoder is configured to suppress the row activation signal, and wherein the PPR mask signal remains active until the apparatus exits the PPR mode;
a PPR controller associated with the memory bank, wherein the PPR controller is configured to provide a PPR blow signal with a state which indicates if the redundant word line is ready to be used; and
a PPR function circuit which is configured to determine if the PPR blow signal is in an illegal state and configured to provide a PPR function signal when the apparatus is in the PPR mode unless the PPR blow signal is in the illegal state, and wherein the memory bank includes a second redundant word line, and wherein the PPR blow signal has a first bit associated with the redundant word line and a second bit associated with the second redundant word line, and wherein the PPR function circuit is configured to determine that the PPR blow signal is in the illegal state if both the first bit and the second bit are at a high logical level at the same time.

11. A method comprising:
entering a post-package repair (PPR) mode of a memory device and providing a PPR mode signal at an active level while the memory device is in the PPR mode;
receiving a first row activation command and providing a row activation signal with a command decoder;
activating a PPR mask signal based on a mask circuit of the memory device receiving the row activation signal at an active level while the PPR mode signal is at an active level; and
receiving a second row activation command with the command decoder but not providing the row activation signal responsive to the PPR mask signal being active, wherein the PPR mask signal remains active while the memory device is in the PPR mode.

12. The method of claim 11, further comprising remapping a row address from a word line of the memory device to a redundant word line.

13. The method of claim 11, further comprising activating a PPR clock signal responsive to the PPR mask signal being active.

14. The method of claim 11, further comprising resetting the PPR mask signal to an inactive level responsive to the memory device exiting the PPR mode.

15. A method comprising:
entering a post-package repair (PPR) mode of a memory device and providing a PPR mode signal at an active level while the memory device is in the PPR mode;
receiving a first row activation command and providing a row activation signal with a command decoder;
activating a PPR mask signal based on a mask circuit of the memory device receiving the row activation signal while the PPR mode signal is at an active level;
receiving a second row activation command with the command decoder but not providing the row activation signal responsive to the PPR mask signal being active, wherein the PPR mask signal remains active while the memory device is in the PPR mode;

providing a fuse blow signal to indicate which of one or more fuses of the memory device should be blown;

determining if the fuse blow signal is in an illegal state; and suppressing a memory bank address if the fuse blow signal is in the illegal state, wherein the fuse blow signal is a multi-bit signal and wherein the illegal state is determined based on multiple bits of the multi-bit signal being at a high logical level at the same time.

16. The method of claim 15, further comprising determining which redundant rows of the memory device are available, and providing the fuse blow signal with a state based on the availability of the redundant rows.

17. The method of claim 15, further comprising blowing selected ones of the one or more fuses based on the fuse blow signal if the fuse blow signal is not in the illegal state.

* * * * *